United States Patent
Qiu et al.

(10) Patent No.: US 12,254,200 B2
(45) Date of Patent: Mar. 18, 2025

(54) MEMORY INITIALIZATION APPARATUS AND METHOD, AND COMPUTER SYSTEM

(71) Applicant: HUAWEI TECHNOLOGIES CO., LTD., Guangdong (CN)

(72) Inventors: Liangen Qiu, Hangzhou (CN); Yi Li, Shenzhen (CN); Baoyao Yang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 21 days.

(21) Appl. No.: 18/147,936

(22) Filed: Dec. 29, 2022

(65) Prior Publication Data

US 2023/0133490 A1 May 4, 2023

Related U.S. Application Data

(63) Continuation of application No. PCT/CN2021/103355, filed on Jun. 30, 2021.

(30) Foreign Application Priority Data

Jun. 30, 2020 (CN) .......................... 202010621216.5

(51) Int. Cl.
G06F 3/06 (2006.01)

(52) U.S. Cl.
CPC .......... *G06F 3/0632* (2013.01); *G06F 3/0604* (2013.01); *G06F 3/0679* (2013.01)

(58) Field of Classification Search
CPC .... G06F 3/0632; G06F 3/0604; G06F 3/0679; G06F 3/0635; G06F 3/0688; G06F 3/061
See application file for complete search history.

(56) References Cited

U.S. PATENT DOCUMENTS

| | | | |
|---|---|---|---|
| 5,768,585 A | 6/1998 | Tetrick et al. | |
| 9,595,350 B2 * | 3/2017 | Spruth | G11C 7/20 |
| 11,411,782 B1 * | 8/2022 | Kuo | H04L 25/03146 |
| 2012/0060058 A1 * | 3/2012 | Prakash | G11C 29/10 |
| | | | 714/E11.169 |

(Continued)

FOREIGN PATENT DOCUMENTS

| | | |
|---|---|---|
| CN | 101379454 A | 3/2009 |
| CN | 101520766 A | 9/2009 |

(Continued)

OTHER PUBLICATIONS

Mahdi Nazm Bojnordi et al: "A programmable memory controller for the DDRx interfacing standards", ACM Transactions on Computer Systems (TOCS), Association for Computing Machinery, Inc, US, vol. 31, No. 4, Dec. 20, 2013 (Dec. 20, 2013), pp. 1-31, XP058036079.

*Primary Examiner* — Sean D Rossiter
(74) *Attorney, Agent, or Firm* — WOMBLE BOND DICKINSON (US) LLP

(57) ABSTRACT

A memory initialization apparatus and method, and a computer system are provided. The memory initialization apparatus includes a first processor core and a memory controller that includes at least one second processor core. In a memory initialization process, the first processor core may invoke the second processor core to perform memory initialization. This helps to shorten memory initialization duration.

28 Claims, 8 Drawing Sheets

(56) References Cited

U.S. PATENT DOCUMENTS

| | | | |
|---|---|---|---|
| 2015/0106560 A1* | 4/2015 | Perego | G06F 12/0638 |
| | | | 711/105 |
| 2015/0378603 A1 | 12/2015 | Dearth et al. | |
| 2016/0070598 A1 | 3/2016 | Vadkerti et al. | |
| 2018/0096711 A1* | 4/2018 | Seo | G11C 5/14 |
| 2018/0186084 A1* | 7/2018 | Ballough | B29C 66/9241 |
| 2021/0193198 A1* | 6/2021 | Johnson | G11C 7/222 |
| 2023/0133490 A1* | 5/2023 | Qiu | G06F 3/0688 |
| | | | 711/154 |

FOREIGN PATENT DOCUMENTS

| | | |
|---|---|---|
| CN | 101609406 A | 12/2009 |
| CN | 101815990 A | 8/2010 |
| CN | 103605591 A | 2/2014 |
| CN | 105446911 A | 3/2016 |
| CN | 107346267 A | 11/2017 |
| CN | 108255527 A | 7/2018 |
| CN | 108388490 A | 8/2018 |
| CN | 109901957 A | 6/2019 |

* cited by examiner

MEMORY INITIALIZATION APPARATUS AND METHOD, AND COMPUTER SYSTEM

CROSS-REFERENCE TO RELATED APPLICATIONS

This application is a continuation of International Application No. PCT/CN2021/103355, filed on Jun. 30, 2021, which claims priority to Chinese Patent Application No. 202010621216.5, filed on Jun. 30, 2020. The disclosures of the aforementioned applications are hereby incorporated by reference in their entireties.

TECHNICAL FIELD

This application relates to the computer processing field, and in particular, to a memory initialization apparatus and method, and a computer system.

BACKGROUND

In a startup process of a computer, it is usually necessary to initialize various internal function systems (such as a memory system and a video card system) of the computer, and memory initialization is an important part of the startup process. Initialization of some internal function systems of the computer requires participation of a memory. Therefore, the computer can initialize these function systems of the computer only after the memory is initialized.

Generally, memory initialization is mainly implemented by a processor core of a processor in the computer. The processor includes a memory controller. The processor core may control, by using the memory controller, a working status of at least one memory chip connected to the processor core. For example, the memory controller may be a double data rate (DDR) subsystem. A process in which the processor core initializes the memory is mainly initialization of the foregoing memory controller and memory chip, and generally may be divided into stages such as initialization configuration, memory training, memory testing, and system configuration.

However, as a memory chip working frequency is increasingly high (for example, a maximum working frequency of a new-generation DDR5 memory chip can be 6400 MHz), memory initialization duration is increasingly long, which affects a computer startup speed. For example, with the increase of a working frequency, the memory chip requires increasingly high time sequence precision. In a memory training process, the processor core needs to continuously adjust a related parameter in the memory controller, to adjust a time sequence relationship between a plurality of signals (such as a clock signal and a data signal) provided for the memory chip, so that the plurality of signals can meet a working requirement of the memory chip after memory training. Because the memory chip requires higher time sequence precision, a quantity of times of adjustment by the processor core is greatly increased, which prolongs memory initialization duration.

Therefore, currently, there is a problem that a time required for memory initialization is excessively long.

SUMMARY

In view of this, this application provides a memory initialization apparatus and method, and a computer system, which help to shorten memory initialization duration.

According to a first aspect, an embodiment of this application provides a memory initialization apparatus. The memory initialization apparatus includes a first processor core and a memory controller. The memory controller includes at least one second processor core. In a memory initialization process, the first processor core may invoke the at least one second processor core to perform memory initialization.

It should be noted that the memory initialization apparatus may be a processor, or may be a processor chip integrated with a processor. In the foregoing example, the processor core may include one or more cores in the processor, that is, the at least one second processor core may be invoked by a single core, or the at least one second processor core may be invoked by a plurality of cores in parallel. Each second processor core may be a logical circuit (or module) with a logical computing capability, and can perform all or some of tasks in memory initialization based on invocation by the first processor core. In addition, a quantity of second processor cores is not limited in this embodiment of this application. In other words, the memory controller may include one or more second processor cores.

In a memory initialization process, the memory controller receives a large amount of control information (such as adjustment information and read/write information) and the like. Memory initialization duration is seriously affected by a delay of the control information. A smaller delay of the control information is more conducive to memory initialization duration shortening.

In the memory initialization apparatus provided in an embodiment of this application, because the at least one second processor core is disposed in the memory controller, compared with the first processor core, a physical link between the at least one second processor core and each structure (such as a memory channel) in the memory controller is shorter, and a control information transmission link delay is smaller. Therefore, invoking the at least one second processor core to perform memory initialization helps to shorten the memory initialization duration. In addition, while the at least one second processor core is performing some of the tasks of memory initialization, the first processor core may further perform another memory initialization task in parallel, thereby helping to further shorten the memory initialization duration.

For example, the memory controller further includes at least one memory channel, and each memory channel is configured to connect to at least one memory chip. When invoking the at least one second processor core, the first processor core may invoke the at least one second processor core to perform channel initialization on the at least one memory channel. Channel initialization may be understood as an initialization task related to a single memory channel. For example, channel initialization may include one or more of tasks such as memory training and memory testing.

Channel initialization duration occupies a comparatively large part of the memory initialization duration, and the channel initialization duration is seriously affected by a delay of the control information. Therefore, in an embodiment of this application, channel initialization is performed by the at least one second processor core in the memory controller. This is more conducive to bringing into play an advantage of a comparatively small control information transmission delay of the second processor core, thereby helping to further shorten the memory initialization duration.

For example, the at least one second processor core in the memory controller may be correspondingly connected to the at least one memory channel in the memory controller, and the correspondence may be any one of a one-to-one correspondence, a one-to-many correspondence, or a many-to-one correspondence. This is not limited in this embodiment of this application.

In an embodiment of this application, after channel initialization is completed for each memory channel in the memory controller, the first processor core may further perform system configuration on the memory controller and a memory chip connected to the at least one memory channel, to generate management information. The management information may be used by the first processor core to manage the memory chip connected to the at least one memory channel. For example, system configuration may include memory interleaving configuration, NUMA setting, and memory map resource management.

It can be understood that, because the at least one second processor core in an embodiment of this application can perform channel initialization in place of the first processor core, a time of the first processor core can be released, so that the first processor core can initialize another component in parallel while the at least one second processor core is performing channel initialization. For example, the other component may be any component other than the memory chip coupled to the memory controller. For example, the component may be a peripheral such as a video card or a network adapter. After channel initialization is completed for any memory channel in the memory controller, the first processor core may further initialize, by using the memory channel for which channel initialization is completed and at least one memory chip connected to the memory channel, a component other than the memory chip connected to the at least one memory channel. According to this embodiment, memory initialization and initialization of the other component can be performed in parallel, thereby helping to further shorten a power-on time of an electronic device (the memory initialization apparatus).

In an embodiment, after initialization configuration is completed for a first memory channel and at least one first memory chip connected to the first memory channel, the first processor core may invoke a second processor core correspondingly connected to the first memory channel. The first memory channel may be any one of the at least one memory channel in the memory controller.

During initialization configuration, the first processor core may complete basic configuration on the first memory channel and the at least one first memory chip connected to the first memory channel, so that the first memory channel and the memory chip can support subsequent channel initialization. For example, in an initialization configuration stage, the first processor core may configure a read/write frequency of the at least one first memory chip and a working frequency of the first memory channel, so that the read/write frequency of the at least one memory chip and the working frequency of the first memory channel are adapted to each other.

In an embodiment of this application, the first processor core may first complete initialization configuration for all of the at least one memory channel in the memory controller, and then invoke the at least one second processor core together; or the first processor core may perform initialization configuration and invoke the second processor core in parallel. Details are as follows:

After invoking the second processor core correspondingly connected to the first memory channel, the first processor core may further continue to perform initialization configuration on a second memory channel and at least one second memory chip connected to the second memory channel. The second memory channel may be any memory channel for which channel initialization is not started in the at least one memory channel. According to this embodiment, initialization configuration and channel initialization can be performed in parallel, thereby helping to further shorten the memory initialization duration.

To allow the first processor core to invoke the at least one second processor core, in an embodiment, the memory controller may further include at least one storage circuit, and the at least one storage circuit may be correspondingly connected to the at least one second processor core in the memory controller. For example, a correspondence between the at least one storage circuit and the at least one second processor core may be any one of a one-to-one correspondence, a one-to-many correspondence, or a many-to-one correspondence.

The first processor core may separately write invocation information to the at least one storage circuit. The invocation information may be information used to implement memory initialization. Any one of the at least one second processor core may read the invocation information from a storage circuit correspondingly connected to the any second processor core, and execute the invocation information. For example, the invocation information may be written to the storage circuit in a form of program code, and the second processor core may implement memory initialization by executing the invocation information. In the foregoing example, the storage circuit may include one or more of a register, a static random access memory, or another electronic component with a storage function.

In an embodiment, after writing the invocation information to a storage circuit correspondingly connected to any second processor core, the first processor core may further write reset deassertion information to the storage circuit. After the any second processor core reads the reset deassertion information, it means that the first processor core has written the reset deassertion information to the storage circuit correspondingly connected to the any second processor core. Therefore, the any second processor core may then read the invocation information from the storage circuit and execute the invocation information.

Generally, the first processor core may write the reset deassertion information and the invocation information to different locations in the storage circuit correspondingly connected to the any second processor core. For example, the storage circuit may include a register and a static random access memory. The first processor core may write the reset deassertion information to a flag bit of the register, and write the invocation information to the static random access memory.

To implement more flexible invocation, in an embodiment, the invocation information may include at least one instruction. The first processor core may invoke, by using an instruction sequence number, the any second processor core to execute an instruction corresponding to the instruction sequence number.

In the foregoing example, each instruction may correspond to one or more operations in memory initialization. The first processor core may flexibly control, by using the instruction sequence number, an operation to be subsequently performed by the any second processor core.

Running of some of instructions further requires a specific execution parameter. Therefore, the first processor core may further write an execution parameter to the storage circuit correspondingly connected to the any second processor core. In this case, the any second processor core may execute, based on the execution parameter in the correspondingly connected storage circuit, the instruction corresponding to the instruction sequence number. For example, when the first processor core invokes the any second processor core to configure a PHY interface in a memory channel, the first processor core may write a resistance value of a termination resistor to the storage circuit correspondingly connected to the any second processor core. In a process of configuring the PHY interface, the any second processor core may configure a termination resistor in the PHY interface based on the resistance value of the termination resistor in the storage circuit.

In an embodiment, the any second processor core may further feed back an instruction execution result to the first processor core. For example, whether the instruction is successfully executed is fed back to the first processor core, so that the first processor core can know an execution status of the any second processor core.

Generally, firmware of the any second processor core is stored in a nonvolatile memory and can be updated, and the firmware includes the invocation information. It should be noted that the at least one second processor core in the memory controller may share same firmware, or may respectively correspond to different firmware. This is not limited in this embodiment of this application. In this embodiment of this application, the firmware of the any second processor core may be upgraded to update the invocation information. For example, the instruction in the invocation information may be increased, decreased, or modified, so as to implement expansion and flexible configuration of memory initialization.

Generally, before writing the invocation information to the storage circuit correspondingly connected to the any second processor core, the first processor core may further allocate a communication address to the storage circuit. The first processor core may read data from or write data to the storage circuit based on the communication address.

It should be noted that the memory initialization apparatus provided in this embodiment of this application not only helps to shorten the memory initialization duration, but also facilitates function expansion for the memory controller, so that the memory controller can flexibly adapt to different application requirements. Examples are provided below:

1. Power Management

After memory initialization is completed, the first processor core may further invoke the second processor core correspondingly connected to the first memory channel, to manage output power of a power supply. The first memory channel may be any memory channel in the memory controller, and the power supply may supply power to the at least one first memory chip connected to the first memory channel. The second processor core correspondingly connected to the first memory channel may monitor a working status of the at least one first memory chip, and adjust the output power of the power supply based on the working status of the at least one first memory chip.

The working status of the first memory chip may include a quantity of times of reading from and/or writing to the first memory chip per unit time, a quantity of times of occurrence of a correctable error in the first memory chip, and the like. The quantity of times of reading from and/or writing to the first memory chip per unit time is used as an example. When the quantity of times of reading from and/or writing to the first memory chip per unit time is greater than a first quantity threshold, the second processor core correspondingly connected to the first memory channel may increase the output power of the power supply, which may also be understood as increasing an output voltage of the power supply and/or increasing an output current of the power supply. When the quantity of times of reading from and/or writing to the first memory chip per unit time is less than a second quantity threshold, the second processor core correspondingly connected to the first memory channel may reduce the output power of the power supply, which may also be understood as reducing an output voltage of the power supply and/or reducing an output current of the power supply.

According to an implementation, the second processor core correspondingly connected to the first memory channel can flexibly adjust the output power of the power supply based on the working status of the first memory chip, thereby helping to reduce power consumption of the first memory chip.

2. Repeated Memory Training

After memory initialization is completed, the first processor core may further invoke the at least one second processor core in the memory controller to perform memory training. Specifically, in a process of using a memory, a time sequence in the memory channel may be offset, which reduces memory read/write stability. In view of this, the first processor core invokes the at least one second processor core to perform memory training, which helps to keep comparatively accurate alignment of the time sequence in the memory channel, thereby helping to improve memory read/write stability.

3. Troubleshooting

After memory initialization is completed, the first processor core may further invoke the at least one second processor core in the memory controller to perform troubleshooting. When the memory controller is faulty, the at least one second processor core may determine a faulty node in the memory controller, and feed back location information of the faulty node to the first processor core.

4. Firmware Upgrade

The first processor core may further upgrade the firmware of the at least one second processor core, to update a function of the at least one second processor core. For example, the first processor core may upgrade the firmware of the at least one second processor core, so that the at least one second processor core can have functions such as troubleshooting and power management. For another example, the first processor core may further update the invocation information in the firmware by upgrading the firmware of the at least one second processor core, so as to optimize a memory initialization process performed by the at least one second processor core. According to this embodiment, a function of the memory controller can be flexibly expanded and optimized without changing a hardware architecture of the memory initialization apparatus.

According to a second aspect, an embodiment of this application provides a memory initialization method. The method may be applied to an apparatus including a first processor core and a memory controller, and the memory controller includes at least one second processor core. For technical effects of corresponding solutions in the second aspect, refer to technical effects that can be achieved by corresponding solutions in the first aspect. Repeated parts are not described in detail. For example, the first processor core invokes the at least one second processor core in the memory controller to perform memory initialization.

For example, the memory controller further includes at least one memory channel, and each memory channel is configured to connect to at least one memory chip. When invoking the at least one second processor core, the first processor core may invoke the at least one second processor core to perform channel initialization on the at least one memory channel in the memory controller. For example, channel initialization may include memory training and/or memory testing.

For example, the at least one second processor core in the memory controller may be correspondingly connected to the at least one memory channel.

After channel initialization is completed for each memory channel in the memory controller, the first processor core may further perform system configuration on the memory controller and a memory chip connected to the at least one memory channel, to generate management information. The management information may be used by the first processor core to manage the memory chip connected to the at least one memory channel. For example, system configuration may include memory interleaving configuration, NUMA setting, and memory map resource management.

It can be understood that, because the at least one second processor core in this embodiment of this application can perform channel initialization in place of the first processor core, a time of the first processor core can be released, so that the first processor core can initialize another component in parallel while the at least one second processor core is performing channel initialization. For example, after channel initialization is completed for any memory channel, the first processor core may further initialize, by using the any memory channel for which channel initialization is completed and at least one memory chip connected to the any memory channel, a component other than the memory chip connected to the at least one memory channel.

In an embodiment, after initialization configuration is completed for a first memory channel and at least one first memory chip connected to the first memory channel, the first processor core may invoke a second processor core correspondingly connected to the first memory channel. The first memory channel may be any one of the at least one memory channel in the memory controller.

In an embodiment of this application, the first processor core may first complete initialization configuration for all of the at least one memory channel in the memory controller, and then invoke the at least one second processor core together; or the first processor core may perform initialization configuration and invoke the second processor core in parallel. Details are as follows:

After invoking the second processor core correspondingly connected to the first memory channel, the first processor core may continue to perform initialization configuration on a second memory channel and at least one second memory chip connected to the second memory channel. The second memory channel is any memory channel for which channel initialization is not started in the at least one memory channel.

To allow the first processor core to invoke the at least one second processor core, in an embodiment, the memory controller may further include at least one storage circuit, and the at least one storage circuit may be correspondingly connected to the at least one second processor core in the memory controller.

The first processor core may separately write invocation information to the at least one storage circuit. The invocation information may be information used to implement memory initialization. Any one of the at least one second processor core may read the invocation information from a storage circuit correspondingly connected to the any second processor core, and execute the invocation information. For example, the storage circuit may include any one or more of a register and/or a static random access memory.

In an embodiment, after writing the invocation information to a storage circuit correspondingly connected to any second processor core, the first processor core may further write reset deassertion information to the storage circuit. After reading the reset deassertion information, any second processor core may read the invocation information from the storage circuit correspondingly connected to the second processor core, and execute the invocation information.

To implement more flexible invocation, in an embodiment, the invocation information may include at least one instruction. The first processor core may invoke, by using an instruction sequence number, the any second processor core to execute an instruction corresponding to the instruction sequence number.

Running of some of instructions further requires a specific execution parameter. Therefore, the first processor core may further first write an execution parameter to the storage circuit correspondingly connected to the any second processor core, and then invoke, by using the instruction sequence number, the any second processor core to execute, based on the execution parameter, the instruction corresponding to the instruction sequence number.

In an embodiment, the second processor core may further feed back an instruction execution result to the first processor core.

Generally, firmware of the any second processor core is stored in a nonvolatile memory and can be updated, and the firmware includes the invocation information.

Generally, before writing the invocation information to the storage circuit correspondingly connected to the second processor core, the first processor core may further allocate a communication address to the storage circuit. The first processor core may read data from or write data to the storage circuit based on the communication address.

It should be noted that the memory initialization method provided in this embodiment of this application not only helps to shorten memory initialization duration, but also facilitates function expansion for the memory controller, so that the memory controller can flexibly adapt to different application requirements. Examples are provided below:

1. Power Management

After memory initialization is completed, the first processor core may further invoke the second processor core correspondingly connected to the first memory channel, to manage output power of a power supply. The first memory channel may be any memory channel in the memory controller, and the power supply may supply power to the at least one first memory chip. The second processor core correspondingly connected to the first memory channel may monitor a working status of the at least one first memory chip. In addition, the second processor core correspondingly connected to the first memory channel may adjust the output power of the power supply based on the working status of the at least one first memory chip.

2. Repeated Memory Training

After memory initialization is completed, the first processor core may further invoke the at least one second processor core in the memory controller to perform memory training.

3. Troubleshooting

After memory initialization is completed, the first processor core may further invoke the at least one second processor core in the memory controller to perform troubleshooting. When the memory controller is faulty, the at least one second processor core may determine a faulty node in the memory controller, and feed back location information of the faulty node to the first processor core.

4. Firmware Upgrade

The first processor core may further upgrade firmware of the at least one second processor core, to update a function of the second processor core. For example, the first processor core may upgrade the firmware of the at least one second processor core, so that the at least one second processor core can have functions such as troubleshooting and power management. For another example, the first processor core may further update the invocation information in the firmware by upgrading the firmware of the at least one second processor core, so as to optimize a memory initialization process performed by the at least one second processor core.

According to a third aspect, an embodiment of this application provides a computer system. The computer system includes the memory initialization apparatus according to any one of the first aspect or the possible implementations of the first aspect, and a memory chip coupled to the memory initialization apparatus. For example, the computer system may be a computer mainboard, or may be an electronic device such as a notebook computer, a mobile phone, or a digital camera. This is not limited in this embodiment of this application.

These aspects or other aspects of this application are clearer and more comprehensible in descriptions of the following embodiments.

DESCRIPTION OF EMBODIMENTS

To make the objectives, technical solutions, and advantages of this application clearer, the following further describes this application in detail with reference to the accompanying drawings. A specific operation method in a method embodiment may also be applied to an apparatus embodiment or a system embodiment. It should be noted that, in descriptions of this application, "at least one" means one or more, and "a plurality of" means two or more. In view of this, "a plurality of" may also be understood as "at least two" in the embodiments of the present application. The term "and/or" describes an association relationship between associated objects and indicates that three relationships may exist. For example, A and/or B may indicate the following three cases: Only A exists, both A and B exist, and only B exists. In addition, the character "/" usually indicates an "or" relationship between associated objects unless otherwise specified. In addition, it should be understood that in the descriptions of this application, terms such as "first" and "second" are merely used for distinguishing and description, but should not be understood as indicating or implying relative importance, or should not be understood as indicating or implying a sequence.

The following clearly describes the technical solutions in the embodiments of this application with reference to the accompanying drawings in the embodiments of this application.

A startup speed of an electronic device is an important indicator for measuring performance of the electronic device. Using a computer as an example, a higher startup speed of the computer can better shorten a waiting time of a user, and therefore is more conducive to improvement of user experience. In the computer, there are a plurality of function systems, such as a memory system and a video card system. The computer can be started up only after most of the function systems are initialized.

Generally, in a computer startup process, the computer usually needs to initialize the memory system first, to initialize another function system by using the initialized memory system. Therefore, memory system initialization (that is, memory initialization) is an important part of an electronic-device startup process. Shorter memory initialization duration better helps to increase an electronic-device startup speed.

Figure 1:
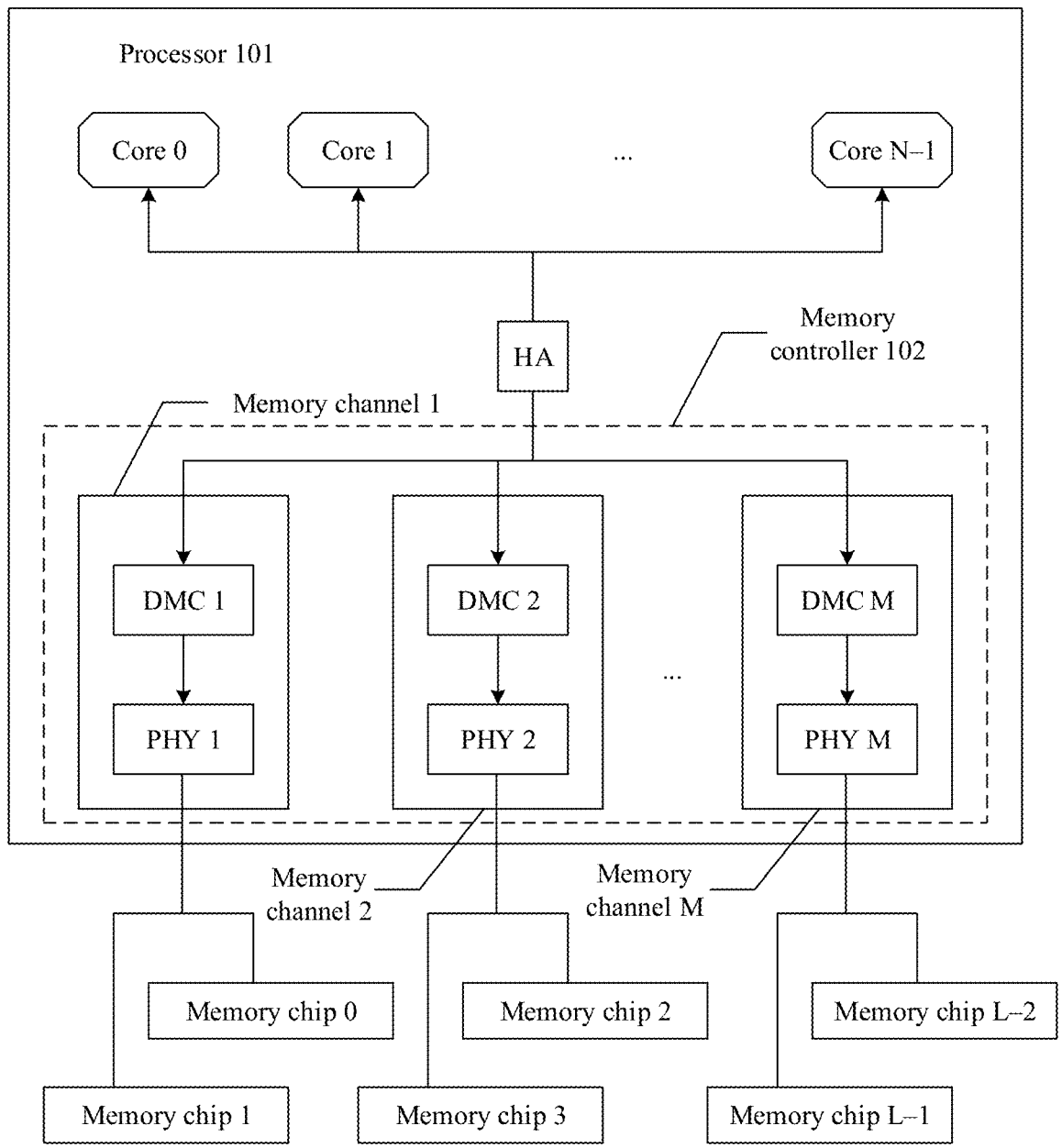
FIG. 1 is a schematic diagram of a structure of an electronic device.

Usually, memory initialization may be implemented by a processor, for example, a central processing unit (CPU), in an electronic device. FIG. 1 is an example of a schematic diagram of a structure of an electronic device. As shown in FIG. 1, the electronic device 100 includes a processor 101 and at least one memory chip (memory chips 0 to L−1), where L is an integer greater than or equal to 1.

The processor 101 includes at least one core, for example, a core 0 to a core N−1 shown in FIG. 1, where N is an integer greater than or equal to 1. Each core can implement a logical computing function. When N is greater than 1, the processor 101 may also be referred to as a multi-core processor. In this case, the plurality of cores in the processor 101 may perform parallel logical computing, to increase an overall computing speed of the processor 101.

As shown in FIG. 1, the processor 101 may further include a memory controller 102. The memory controller 102 may control the memory chip 0 to the memory chip L−1. For example, the memory controller 102 may perform a read/write operation and a refresh operation on the memory chip 0 to the memory chip L−1. For example, the memory controller 102 may be a double data rate (DDR) subsystem.

In an embodiment, as shown in FIG. 1, the memory controller 102 may include at least one memory channel, for example, a memory channel 1 to a memory channel M, where M is an integer greater than or equal to 1. Each memory channel may be connected to at least one memory chip, and each memory channel can control at least one memory chip connected to the memory channel.

As shown in FIG. 1, the memory channel 1 is connected to the memory chip 0 and a memory chip 1, and the memory channel 1 can control the memory chip 0 and the memory chip 1. For another example, the memory channel M is connected to a memory chip L−2 and the memory chip L−1, and the memory channel M can control the memory chip L−2 and the memory chip L−1.

The memory channel 1 includes a DDR management controller (DMC) 1 and a physical layer interface (PHY interface) 1. The read/write operation is used as an example. The DMC 1 may parse a read/write request sent by the cores 0 to N−1, and read data from or write data to the memory chip 0 and the memory chip 1 through the PHY interface 1 based on a parsing result. Similarly, a memory channel 2 may also include a DMC 2 and a PHY interface 2, and the memory channel M may also include a DMC M and a PHY interface M. Details are not described herein.

After the electronic device is powered on, the processor 101 may perform memory initialization after completing basic system component initialization. For example, the processor 101 may perform memory initialization after completing system phase locked loop (system PLL) initialization, and initialization of system components such as a serial port and an inter-integrated circuit (I2C) interface.

Usually, in a memory initialization process, the processor 101 not only needs to initialize the memory chip 0 to the memory chip L−1, but also needs to initialize the memory controller 102. Memory initialization may be understood as configuration and adjustment of a plurality of parameters in the memory chip 0 to the memory chip L−1 and the memory controller 102.

A single-core initialization manner is used as an example. The processor 101 includes a core serving as a master core, and the master core initializes the memory controller 102 and the memory chip 0 to the memory chip L−1.

In a specific example, it is assumed that a core 0 is the master core. The core 0 may sequentially initialize, in a preset order, the M memory channels in the memory controller 102 and the memory chip 0 to the memory chip L−1. For example, the core 0 may first initialize the memory channel 1, the memory chip 0, and the memory chip 1, then initialize the memory channel 2, a memory chip 2, and a memory chip 3, . . . , and finally initialize the memory channel M, the memory chip L−2, and the memory chip L−1.

Initialization of the memory channel 1, the memory chip 0, and the memory chip 1 is used as an example. This process includes stages such as initialization configuration, memory training, and memory testing. Details are as follows:

Initialization Configuration

During initialization configuration, the core 0 may perform basic configuration on the M memory channels in the memory controller 102 and the memory chip 0 to the memory chip L−1, so that the memory controller 102 and the memory chip 0 to the memory chip L−1 can support subsequent channel initialization.

For example, the core 0 may separately read serial presence detect (SPD) information in the memory chip 0 and the memory chip 1. The SPD information is stored in a small-capacity memory in the memory chip, and includes information such as a memory capacity and a read/write frequency of the memory chip. The core 0 may determine, by attempting to read the SPD information, whether the memory channel 1 is connected to the memory chip 0 and the memory chip 1. After determining that the memory channel 1 is connected to the memory chip 0 and the memory chip 1, the core 0 may further perform initialization configuration on the memory channel 1, the memory chip 0, and the memory chip 1 based on the SPD information.

For example, the memory chip 0 and the memory chip 1 usually have a same read/write frequency. The core 0 may configure, based on read/write frequencies of the memory chip 0 and the memory chip 1, a working frequency of a phase locked loop (PLL) adapted to the memory chip 0 and the memory chip 1. The PLL may provide a clock signal for the memory chip 0 and the memory chip 1. For another example, the core 0 may alternatively configure a working frequency of the memory channel 1 based on the read/write frequencies of the memory chip 0 and the memory chip 1, to adapt the working frequency of the memory channel 1 to the read/write frequencies of the memory chip 0 and the memory chip 1, so that a control signal output by the memory channel 1 can be identified by the memory chip 0 and the memory chip 1.

Memory Training

Figure 2:
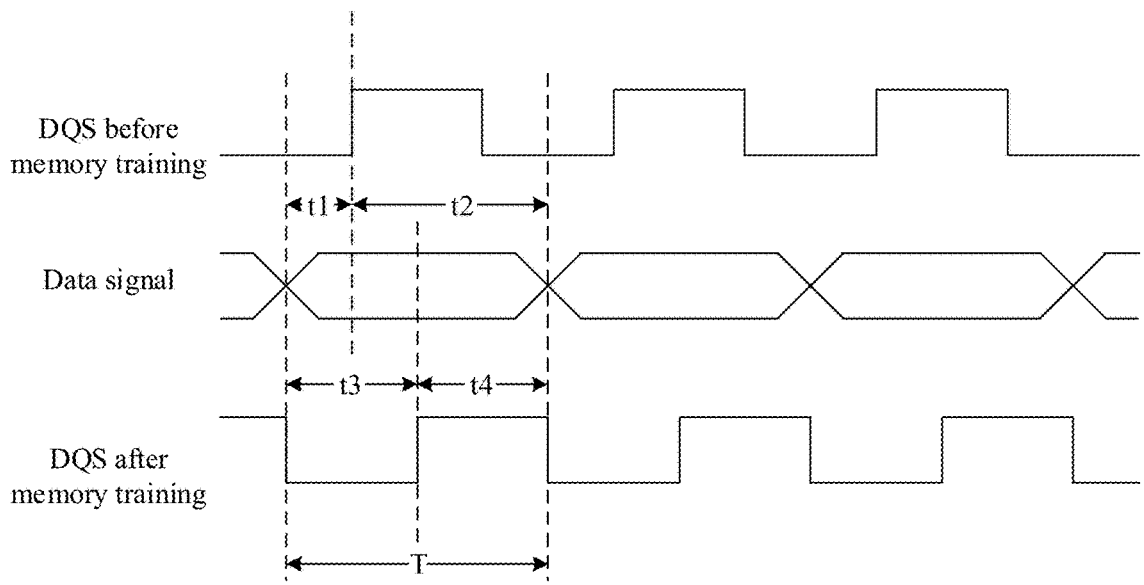
FIG. 2 is a schematic diagram of a comparison between time sequence relationships between a DQS signal and a data signal before and after memory training.

Control signals output by the memory channel 1 include a data strobe signal (DQS) and a data signal. A rising edge or falling edge of the DQS can trigger the memory chip 0 and the memory chip 1 to receive the data signal. For example, the rising edge of the DQS can trigger the memory chip 0 and the memory chip 1 to receive the data signal. As shown in FIG. 2, the DQS and the data signal have a same cycle T. One cycle T may be further divided into two parts based on the rising edge of the DQS, where a part before the rising edge may be referred to as a setup time, and a part after the rising edge may be referred to as a hold time.

For the DQS before memory training shown in FIG. 2, one cycle T may be divided into a setup time t1 and a hold time t2 based on a rising edge of the DQS before memory training. The setup time t1 is comparatively short, and consequently, the memory chip 0 (the memory chip 1 likewise) prematurely starts to receive the data signal. Meanwhile, a level change of the data signal also requires a specific delay. In this case, misreading may occur on the memory chip 0.

For example, if the memory chip 0 starts to receive the data signal before the data signal rises to a high level, the data signal at the high level may be misread as the data signal at a low level. It can be learned that the DQS before memory training is not conducive to improving stability of the memory channel 1, the memory chip 0, and the memory chip 1. Similarly, if the hold time t2 is comparatively short, the memory chip 0 may have no time to read a level status of the data signal, and consequently, a stability problem may also occur.

For the DQS after memory training shown in FIG. 2, one cycle T may be divided into a setup time t3 and a hold time t4 based on a rising edge of the DQS after memory training. The setup time t3 and the hold time t4 have same or close duration. The "close" may be understood as that a difference between the setup time t3 and the hold time t4 is not greater than a specified threshold. In this case, the memory chip 0 can read a comparatively accurate level status of the data signal. This helps to ensure stability of the memory channel 1, the memory chip 0, and the memory chip 1.

It should be noted that, usually, adjusting a time sequence relationship between the DQS and the data signal is merely a part of tasks in memory training. In addition to alignment between the DQS and the data signal, time sequence alignment between a plurality of signals such as the DQS and the clock signal also needs to be performed. In addition, during memory training, the core 0 may further adjust a magnitude of termination resistance, a reference voltage value, and the like in the memory channel 1, which are not enumerated one by one in this embodiment of this application. The memory channel 1 can be matched with the memory chip 0 and the memory chip 1 through memory training, so that the memory channel 1, the memory chip 0, and the memory chip 1 can run stably in a subsequent memory control process.

Memory Testing

After completing memory training for the memory channel 1, the memory chip 0, and the memory chip 1, the core 0 may further perform memory testing on the memory channel 1, the memory chip 0, and the memory chip 1, to verify a memory training result. Generally, memory testing includes operations such as margin testing, eye scan, storage testing, and storage cleanup.

After memory testing is passed, channel initialization of the memory channel 1, the memory chip 0, and the memory chip 1 is completed. The core 0 may sequentially complete initialization of the memory channel 1, the memory chip 0, and the memory chip 1 to the memory channel M, the memory chip L−2, and the memory chip L−1 according to the foregoing process.

Then, the core 0 may further perform system configuration on the memory controller 102 and the memory chip 0 to the memory chip L−1, to generate management information. The management information may be used by the core 0 to the core N−1 to manage the memory chip 0 to the memory chip L−1. For example, system configuration may include memory interleaving configuration, non-uniform memory access (NUMA) setting, and the like.

Although memory initialization can be implemented by using the foregoing process, with the increase of a memory chip capacity and a memory chip read/write frequency, duration of memory initialization implemented by using the foregoing process is increasingly long. For example, in a process of memory training shown in FIG. 2, because the read/write frequencies of the memory chip 0 and the memory chip 1 are increased, duration of the cycle T is shortened, and the core 0 needs to perform more refined adjustment to make the setup time t3 and the hold time t4 equal or close. As a result, the core 0 needs to send a larger amount of adjustment information to the memory channel 1.

As shown in FIG. 1, there is a comparatively long physical link between the core 0 and the memory channel 1, and the physical link further includes elements such as a home agent (HA). Consequently, a delay between the core 0 and the memory channel 1 is comparatively long. The long delay and the increased amount of the adjustment information greatly prolong duration of memory training for the memory channel 1, and memory training for another memory channel also has the same problem. Therefore, memory initialization duration is greatly prolonged. In addition, because a memory chip read/write frequency is increased, a quantity of signals on which time sequence alignment needs to be performed in a memory training process may also be increased, which further prolongs memory initialization duration.

For another example, in a memory testing process, the core 0 writes data to the memory chip 0 (e.g., storage testing), and after the testing is completed, further needs to clear the data written in the testing process (e.g., storage cleanup). Because a capacity of the memory chip 0 is increased, the core 0 needs to write more data to the memory chip 0 during storage testing, and clear more data during storage cleanup. It can be learned that, as a memory chip capacity increases, an amount of information read and written between the core 0 and the memory channel 1 is also increased, and therefore, memory initialization duration is also prolonged.

To sum up, under impact of a delay of control information (such as the foregoing adjustment information and read/write information) received by the memory controller 102, with the increase of a memory chip capacity and a memory chip working frequency, memory initialization duration is increasingly long.

In view of this, embodiments of this application provide a memory initialization apparatus and solution, to shorten memory initialization duration by adding a second processor core to a memory controller. It should be noted that the memory initialization apparatus provided in the embodiments of this application may be a processor configured to control a memory, or may be a chip integrated with a processor, such as a CPU, a system on chip (SoC), or an electronic control unit.

Figure 3:
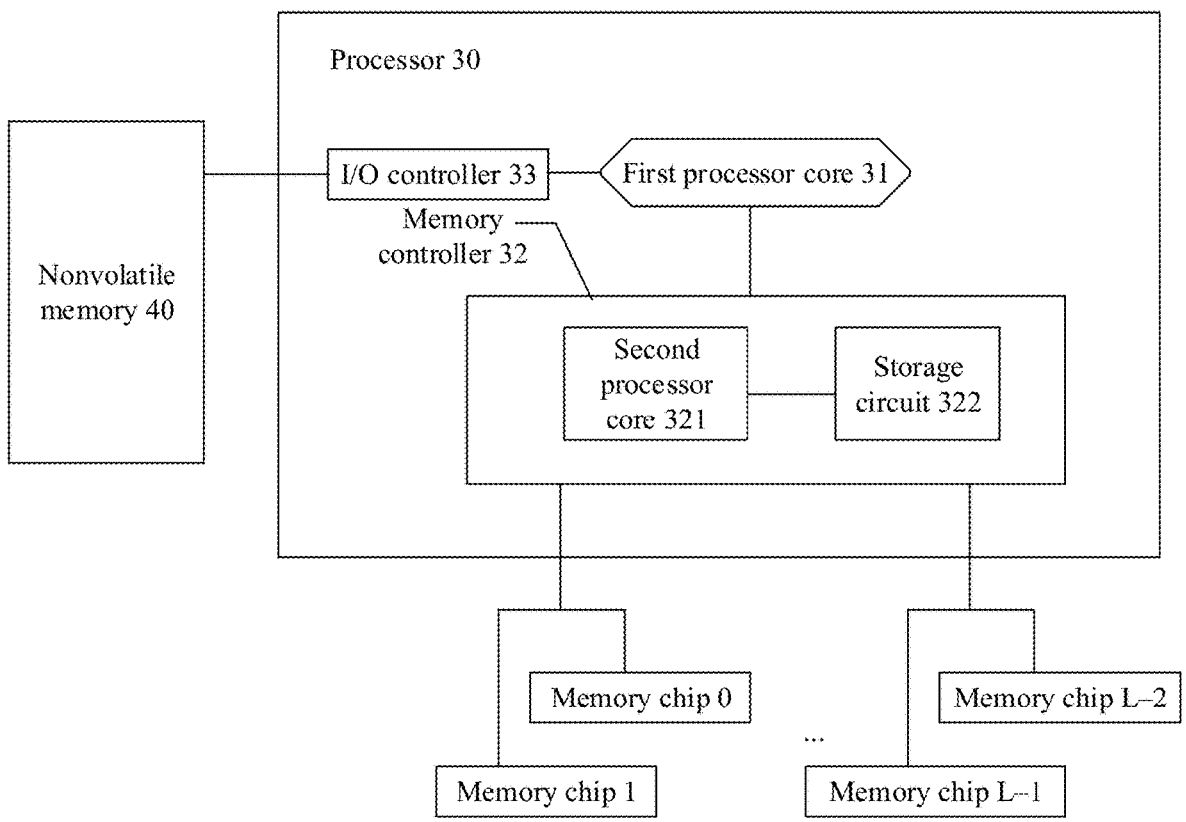
FIG. 3 is a schematic diagram of a structure of a memory initialization apparatus according to an embodiment of this application.

For example, as shown in FIG. 3, a processor 30 provided in an embodiment of this application includes a first processor core 31 and a memory controller 32, and the memory controller 32 includes a second processor core 321. In a process of performing memory initialization, the first processor core 31 may invoke the second processor core 321 to perform memory initialization.

Because the second processor core 321 is disposed in the memory controller 32, compared with the first processor core 31, a physical link between the second processor core 321 and each structure (such as a memory channel) in the memory controller 32 is shorter, and a signal transmission link delay is smaller. Therefore, invoking the second processor core 321 to perform some or all of tasks in memory initialization helps to shorten initialization duration. In addition, while the second processor core 321 is performing some of the tasks of memory initialization, the first processor core 31 may further perform another memory initialization task in parallel, thereby helping to further shorten the memory initialization duration.

The following further describes, as examples, specific implementations of the second processor core 321 and the first processor core 31.

1. Second Processor Core 321

The second processor core 321 may be a logical circuit (or module) with a logical computing capability, and can perform, based on invocation by the first processor core, all or some of the tasks in memory initialization.

In an embodiment, the second processor core 321 may be configured to perform an initialization task related to a single memory channel, that is, channel initialization. For example, channel initialization may include one or more of tasks such as memory training and memory testing.

In a current memory initialization solution, the first processor core 31 needs to send a large amount of control information (such as the read/write information sent in the memory testing process and the adjustment information sent in the memory training process described above) to the memory controller 32. Under impact of a link delay between the first processor core 31 and the memory controller 32, channel initialization occupies a comparatively large amount of time in memory initialization.

Compared with the link delay between the first processor core 31 and the memory controller 32, a smaller link delay can be implemented for the second processor core 321 because the second processor core 321 is located inside the memory controller 32. Therefore, invoking the second processor core 321 to perform channel initialization can significantly shorten channel initialization duration, thereby shortening the overall memory initialization duration.

It should be noted that a quantity of second processor cores 321 in the memory controller 32 is not limited in this embodiment of this application. For example, in FIG. 4, the memory controller 32 may include one second processor core 321, and the second processor core 321 is separately connected to M memory channels. In this case, the first processor core 31 may invoke the second processor core 321 to perform channel initialization on the M memory channels.

For another example, the memory controller 32 may include a plurality of second processor cores, and each second processor core may be connected to one or more memory channels. Specifically, a connection relationship between each second processor core and a memory channel may be any one of a one-to-one correspondence, a one-to-many correspondence, or a many-to-one correspondence.

If one second processor core is connected to a plurality of memory channels, the first processor core 31 may invoke the second processor core to perform channel initialization on the plurality of memory channels connected to the second processor core. If a plurality of second processor cores are connected to one memory channel, the first processor core 31 may invoke the plurality of second processor cores to perform channel initialization on the memory channel.

Figure 5:
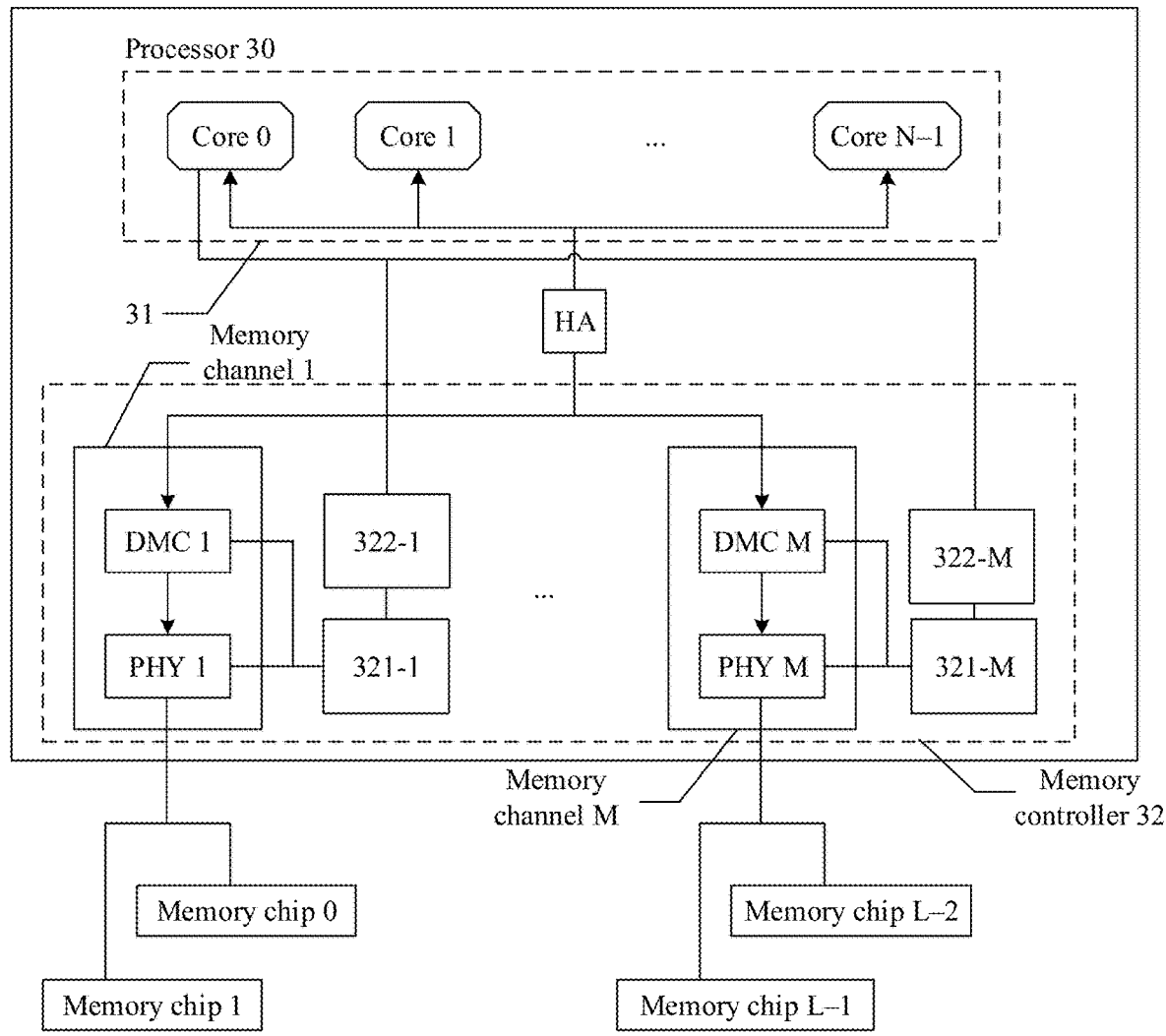
FIG. 5 is a schematic diagram of a structure of another specific memory initialization apparatus according to an embodiment of this application.

An example of a case in which one second processor core is connected to one memory channel is shown in FIG. 5. The memory controller 32 includes M second processor cores (a second processor core 321-1 to a second processor core 321-M). The M second processor cores are respectively connected to M memory channels in the memory controller 32 in one-to-one correspondence.

Each second processor core can perform, based on invocation by the first processor core 31, channel initialization on a memory channel connected to the second processor core. In other words, the first processor core 31 may invoke any second processor core to perform channel initialization on a memory channel connected to the second processor core. For example, the first processor core 31 may invoke the second processor core 321-1 to perform channel initialization on a memory channel 1, and invoke the second processor core 321-M to perform channel initialization on a memory channel M.

For ease of understanding, unless otherwise specified, the processor 30 shown in FIG. 5 is used as an example for description below in this embodiment of this application.

2. First Processor Core 31

In an embodiment of this application, the first processor core 31 may include one core (for example, a core 0 serving as a master core) in the processor 30, or may include a plurality of cores in the processor 30. In other words, the M second processor cores in the memory controller 32 may be invoked by one core in the processor 30, or the M second processor cores in the memory controller 32 may be invoked in parallel by a plurality of cores in the processor 30.

For example, a value of M is 8, that is, the memory controller 32 includes eight memory channels and eight second processor cores (a second processor core 321-1 to a second processor core 321-8). The core 0 may invoke the second processor core 321-1 to a second processor core 321-3, to perform channel initialization on a memory channel 1 to a memory channel 3. A core 1 invokes a second processor core 321-4 to the second processor core 321-8, to perform channel initialization on a memory channel 4 to a memory channel 8. According to this implementation, the core 0 and the core 1 may invoke the second processor cores in parallel, thereby helping to further shorten the initialization duration.

In this embodiment of this application, the first processor core 31 may invoke the second processor core. In view of this, as shown in FIG. 3, the memory controller 32 may further include a storage circuit 322. The storage circuit 322 may be used as an interface for the first processor core 31 to invoke the second processor core 321.

It should be noted that a quantity of storage circuits 322 is not limited in this embodiment of this application, and the memory controller 32 may include one or more storage circuits. A correspondence between each storage circuit and a second processor core may be any one of a one-to-one correspondence, a one-to-many correspondence, or a many-to-one correspondence. For example, in a case of the one-to-one correspondence, one storage circuit may be used as an invocation interface of one second processor core; in a case of the one-to-many correspondence, one storage circuit may be used as an invocation interface of a plurality of second processor cores; in a case of the many-to-one correspondence, a plurality of storage circuits may be jointly used as an invocation interface of one second processor core.

Figure 4:
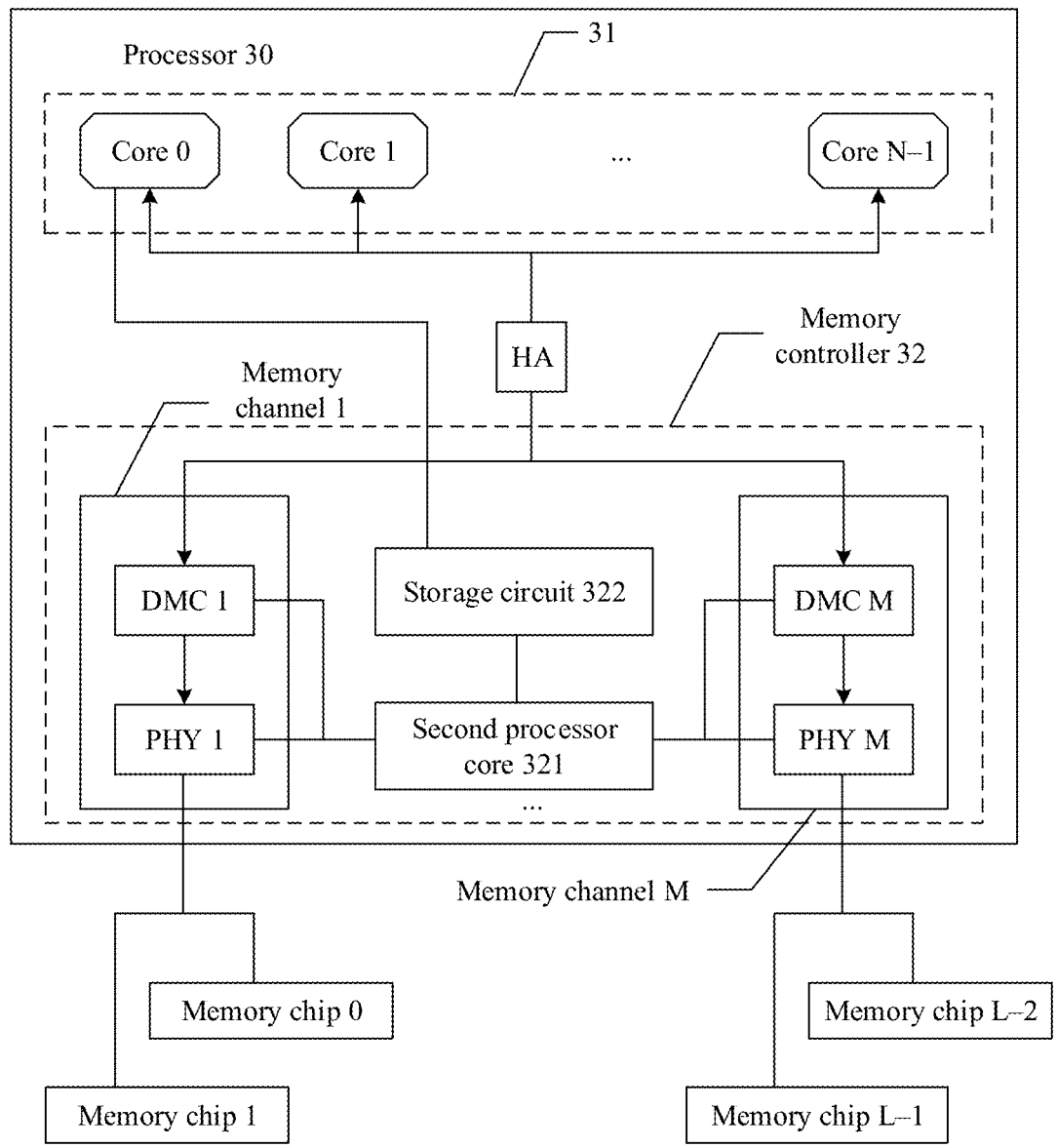
FIG. 4 is a schematic diagram of a structure of a specific memory initialization apparatus according to an embodiment of this application.

For ease of understanding, the one-to-one correspondence is used as an example for description below in this embodiment of this application. As shown in FIG. 4, the second processor core 321 is correspondingly connected to the storage circuit 322. For another example, in FIG. 5, the second processor core 321-1 is correspondingly connected to a storage circuit 322-1, . . . , and the second processor core 321-M is correspondingly connected to a storage circuit 322-M.

Figure 6:
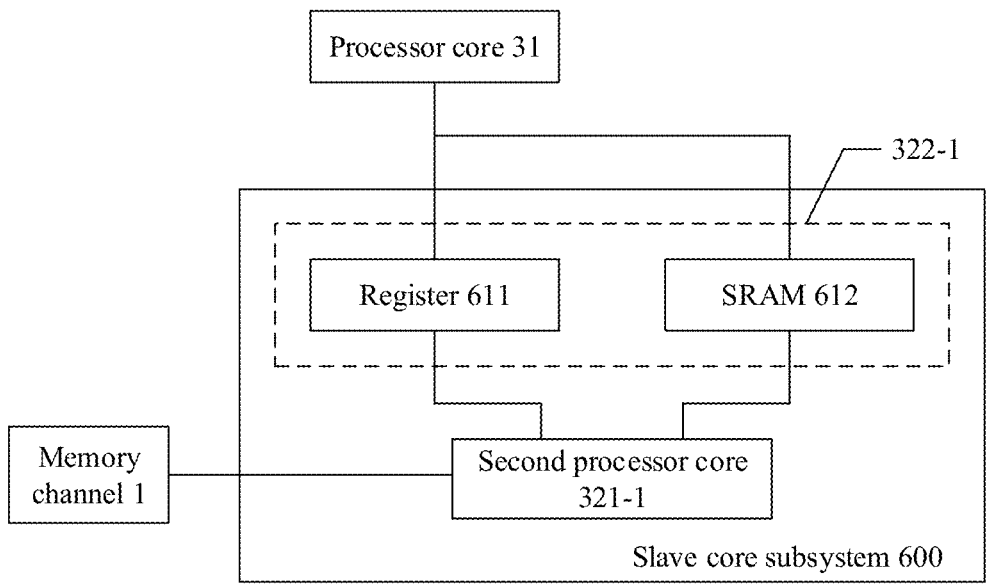
FIG. 6 is a schematic diagram of a structure of a slave core subsystem according to an embodiment of this application.

If the storage circuit is connected to the second processor core in one-to-one correspondence, the storage circuit and the second processor core may also be understood as a slave core subsystem. As shown in FIG. 6, a slave core subsystem 600 is a slave core subsystem that includes the second processor core 321-1 and the storage circuit 322-1 in FIG. 5. The storage circuit 322-1 is separately connected to the first processor core 31 and the second processor core 321-1, and the second processor core 321-1 is connected to the memory channel 1.

When invoking the second processor core 321-1, the first processor core 31 may write invocation information to the storage circuit 322-1. The second processor core 321-1 may read the invocation information from the storage circuit 322-1 and execute the invocation information. In this way, the second processor core 321-1 is invoked. The invocation information may be information used to implement memory initialization. For example, the invocation information may be written to the storage circuit 322-1 in a form of program code, and the second processor core 321-1 performs memory initialization by executing the invocation information. For example, the second processor core 321-1 may implement channel initialization of the memory channel 1 by executing the invocation information.

In an embodiment, after writing the invocation information to the storage circuit 322-1, the first processor core 31 may further write reset deassertion information to the storage circuit 322-1. After reading the reset deassertion information, the second processor core 321-1 reads the invocation information from the storage circuit 322-1 and executes the invocation information.

Generally, the first processor core 31 may write the reset deassertion information and the invocation information to different locations in the storage circuit 322-1. For example, as shown in FIG. 6, the storage circuit 322-1 includes a register 611 and a static random access memory (SRAM) 612. The first processor core 31 may write the reset deassertion information to a flag bit of the register 611, and write the invocation information to the SRAM 612.

For example, an initial level state of the flag bit in the register 611 may be 0, and after the reset deassertion information is written, the level state of the flag bit is changed to 1. The second processor core 321-1 may periodically read a level state of the flag bit. When the level state of the flag bit is changed to 1, it means that the first processor core 31 has written the invocation information to the SRAM 612. In this case, the second processor core 321-1 may read the invocation information from the SRAM 612 and execute the invocation information.

Generally, before invoking the second processor core 321-1, the first processor core 31 may further allocate a communication address to the storage circuit 322-1. Then, the first processor core 31 may read data from or write data to the storage circuit 322-1 based on the communication address. For example, the first processor core 31 may address the register 611 and the SRAM 612 of the storage circuit 322-1 together within an addressing range of the first processor core 31, so that the first processor core 31 can read data from or write data to the register 611 and the SRAM 612.

The following further describes the invocation information by using examples.

In an embodiment, the invocation information may be written to the second processor core 321-1 in a form of complete code, and the second processor core 321-1 executes the complete code, thereby completing channel initialization for the memory channel 1.

In another embodiment, to implement more flexible invocation, the invocation information may include at least one instruction. Each instruction may correspond to one or more operations in memory initialization. When invoking the second processor core 321-1, the first processor core 31 may flexibly invoke, by using an instruction sequence number, the second processor core 321-1 to execute an instruction corresponding to the instruction sequence number, so as to flexibly control an operation performed by the second processor core 321-1.

For example, the invocation information may be divided into at least configuration function information, training function information, and testing function information. An instruction included in the configuration function information corresponds to a channel configuration related operation, and the second processor core 321-1 may complete configuration of the memory channel 1, a memory chip 0, and a memory chip 1 by running the configuration function information. An instruction included in the training function information corresponds to a memory training related operation, and the second processor core 321-1 may perform memory training on the memory channel 1 by running the training function information. An instruction included in the testing function information corresponds to a memory testing related operation, and the second processor core 321-1 performs memory testing on the memory channel 1 by running the testing function information.

Using the configuration function information as an example, a correspondence between an instruction sequence number and an instruction may be shown in Table 1 below:

TABLE 1

| Instruction sequence number | Instruction |
|---|---|
| f1 | RCD configuration |
| f2 | DB configuration |
| f3 | PHY interface configuration |
| f4 | DMC configuration |
| f5 | MR configuration |
| f6 | Other configuration |

An instruction corresponding to the instruction sequence number f1 is to configure a registered clock driver (RCD). The RCD is located in the memory chip 0 and the memory chip 1. The first processor core 31 may invoke, by using the instruction sequence number f1, the second processor core 321-1 to configure the RCD in the memory chip 0 and the memory chip 1.

An instruction corresponding to the instruction sequence number f2 is to configure a data buffer (DB). The DB is located in the memory chip 0 and the memory chip 1. The first processor core 31 may invoke, by using the instruction sequence number f2, the second processor core 321-1 to configure the DB in the memory chip 0 and the memory chip 1.

An instruction corresponding to the instruction sequence number f3 is to configure a PHY interface. the first processor core 31 may invoke, by using the instruction sequence number f3, the second processor core 321-1 to configure the PHY interface.

An instruction corresponding to the instruction sequence number f4 is to configure a DMC. the first processor core 31 may invoke, by using the instruction sequence number f4, the second processor core 321-1 to configure the DMC.

An instruction corresponding to the instruction sequence number f5 is to configure a mode register (MR). The first processor core 31 may invoke, by using the instruction sequence number f5, the second processor core 321-1 to configure the MR.

Running of some of instructions further requires a specific execution parameter. Therefore, when invoking the second processor core 321-1 to execute an instruction, the first processor core 31 may further write, to the storage circuit 322-1, an execution parameter corresponding to the instruction, so that the second processor core 321-1 can execute the instruction.

For example, when the first processor core 31 invokes, by using the instruction sequence number f3, the second processor core 321-1 to configure the PHY interface, the first processor core 31 may write a resistance value of a termination resistor to the storage circuit 322-1. In a process of configuring the PHY interface, the second processor core 321-1 may configure a termination resistor in the PHY interface based on the resistance value of the termination resistor in the storage circuit 322-1.

In an embodiment, after executing any instruction, the second processor core 321-1 may further feed back an execution result of the instruction to the first processor core 31. For example, whether the instruction is successfully executed is fed back to the first processor core 31.

Figure 7:
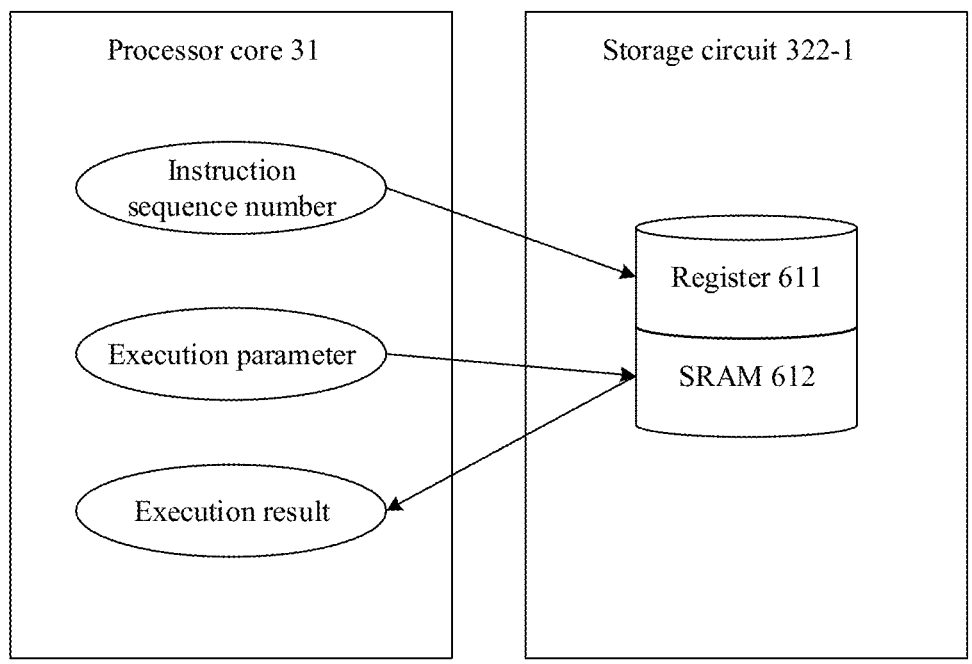
FIG. 7 is a schematic diagram of an invocation manner of a second processor core according to an embodiment of this application.

In an embodiment, as shown in FIG. 7, the first processor core 31 may write the instruction sequence number to the register 611, and write, to the SRAM 612, the execution parameter corresponding to the instruction. After reading the instruction sequence number from the register 611, the second processor core 321-1 reads, from the SRAM 612, the instruction corresponding to the instruction sequence number and the execution parameter corresponding to the instruction. Then, the second processor core 321-1 may execute the target instruction based on the read execution parameter.

After executing the target instruction, the second processor core 321-1 may further write an instruction execution result to the SRAM 612, so that the first processor core 31 can read the instruction execution result from the SRAM 612. In this way, the first processor core 31 can know an execution status of the second processor core 321-1. In another embodiment, the first processor core 31 may alternatively write the instruction sequence number to the SRAM 612.

In an embodiment of this application, the storage circuit 322-1 is used as an interaction interface between the first processor core 31 and the second processor core 321-1. An interaction interface format is agreed on, so that in a memory initialization process, the first processor core 31 can invoke, by writing to the register or SRAM space of the storage circuit 322-1, the second processor core 321-1 to perform some or all of the tasks in memory initialization; and invocation of another second processor core is similar. Memory initialization is performed through cooperation and interaction between the first processor core 31 and each second processor core.

The "interaction interface format" may be understood as a correspondence between different types of data and different storage intervals in the storage circuit 322-1. For example, a storage structure in the SRAM 612 may be shown in FIG. 8. A 0-76K interval is used to store the invocation information, written by the first processor core 31 and read by the second processor core 321-1. In an embodiment, the invocation information may be information in firmware of the second processor core 321-1, in other words, the firmware of the second processor core 321-1 includes the invocation information. The 0-76K interval in the SRAM 612 may be used to store the firmware of the second processor core 321-1.

A 76K-78K interval is used to store an instruction sequence number queue, written by the first processor core 31 and read by the second processor core 321-1. It can be understood that, if the register 611 stores the instruction sequence number, the part of storing the instruction sequence number queue may be omitted. A 78K-84K interval is used to store feedback information, written by the second processor core 321-1 and read by the first processor core 31.

In an embodiment of this application, the feedback information may include print information, event information, an instruction execution result, and the like. For example, an interval from 80K to 84K may be used to store the print information. For example, when performing channel initialization, the second processor core 321-1 may feed back current execution progress as the print information to the first processor core 31. An interval from 78K to 80K may be used to store an event queue. For example, the second processor core 321-1 may report fault information of the memory channel 1 by using the event queue. An 84K-96K interval is used to store basic data of the memory channel 1, written by the first processor core 31 and read by the second processor core 321-1. The basic data may be understood as data that may be used during running of the second processor core 321-1, for example, may be global data such as a working frequency of the processor 30 and a startup mode of memory initialization.

Figure 9:
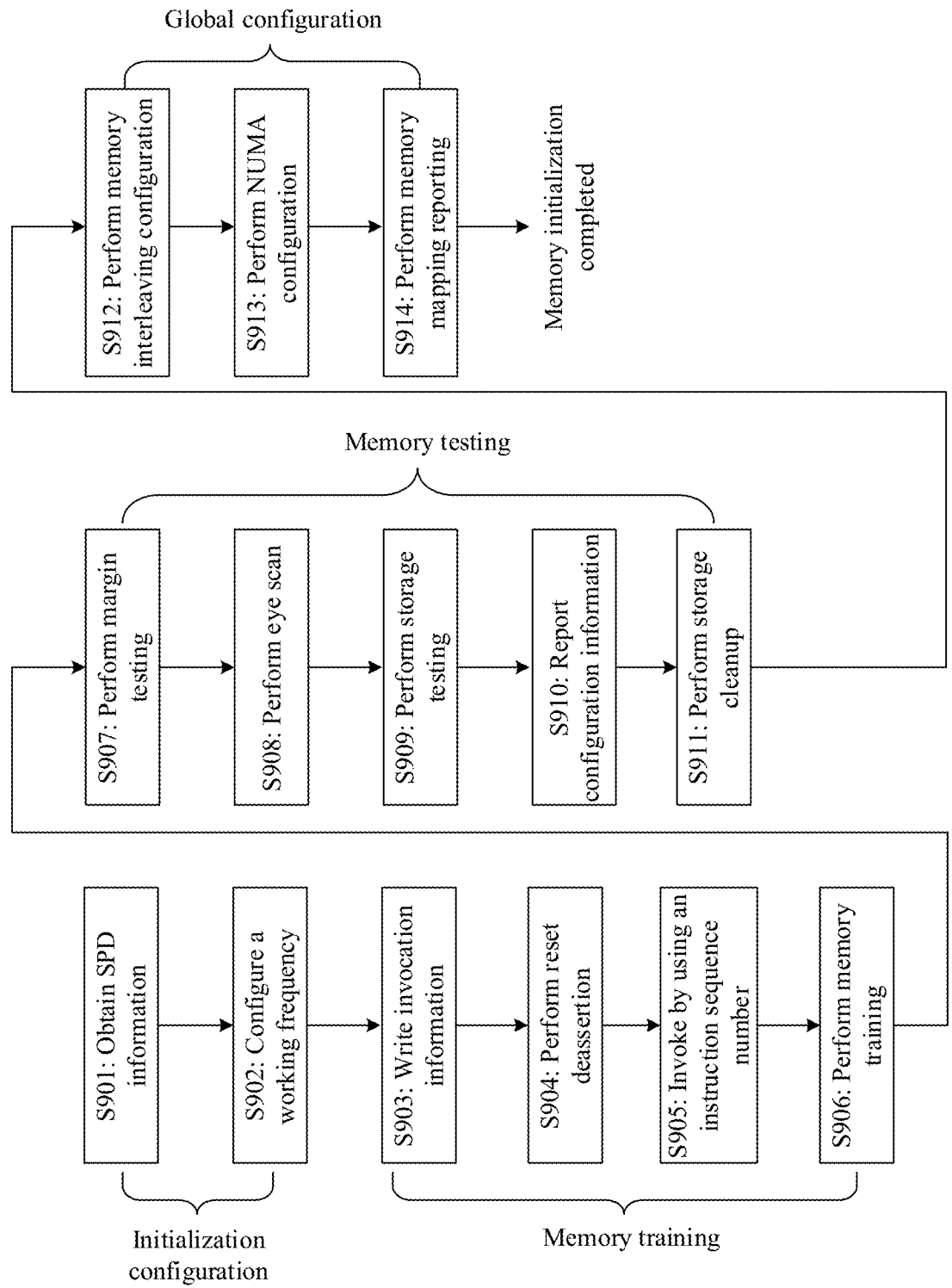
FIG. 9 is a schematic flowchart of a memory initialization method according to an embodiment of this application.

In the following, a memory initialization procedure shown in FIG. 9 is used as an example to further describe the memory initialization apparatus (e.g., the processor 30) provided in this embodiment of this application.

1. Initialization Configuration Stage

Similar to a conventional memory initialization process, in an embodiment of this application, the initialization configuration stage completes basic configuration for the memory controller 32 and the memory chip 0 to the memory chip L−1, so that the memory controller 32 and the memory chip 0 to the memory chip L−1 can perform a subsequent initialization process.

In an embodiment, the first processor core 31 may invoke the second processor core 321-1, so that the second processor core 321-1 performs initialization configuration on the memory channel 1, the memory chip 0, and the memory chip 1. In another embodiment, alternatively, the first processor core 31 may directly perform initialization configuration on the memory channel 1, the memory chip 0, and the memory chip 1. This is not limited in this embodiment of this application.

For example, using the memory channel 1 as an example, as shown in FIG. 9, the initialization configuration stage includes the following operations:

In operation S901, the first processor core 31 obtains SPD information.

In operation S902, the first processor core 31 configures read/write frequencies of the memory chip 0 and the memory chip 1 and a working frequency of the memory channel 1 based on the SPD information.

For specific implementation of operations S901 and S902, refer to the conventional memory initialization process. Details are not described herein again.

For example, as shown in FIG. 3, the processor 30 may further include an input/output (I/O) controller 33. One end of the I/O controller 33 is connected to the first processor core 31, and another end of the I/O controller 33 is connected to a nonvolatile memory 40.

The nonvolatile memory 40 may be a memory such as a flash memory or a magnetic disk. The nonvolatile memory 40 stores firmware of the first processor core 31. For example, the firmware of the first processor core 31 may include unified extensible firmware interface (UEFI) code.

After the processor 30 is powered on, the first processor core 31 may read the firmware of the first processor core 31 from the nonvolatile memory 40, and execute the firmware. For example, the first processor core 31 may implement the foregoing initialization configuration by executing the firmware.

It should be noted that, if the first processor core 31 directly performs initialization configuration, in an embodiment, the first processor core 31 may first complete initialization configuration on the memory channel 1 to the memory channel M and the memory chip 0 to the memory chip L−1 together, and then, the first processor core 31 invokes the second processor core 321-1 to the second processor core 321-M together to perform channel initialization.

In another embodiment, the first processor core 31 may invoke the second processor core 321-1 after completing initialization configuration for the memory channel 1, the memory chip 0, and the memory chip 1. In a process in which the second processor core 321-1 performs channel initialization on the memory channel 1 based on invocation by the first processor core 31, the first processor core 31 may continue to perform initialization configuration on the memory channel 2, the memory chip 2, and the memory chip 3. In other words, the first processor core 31 may perform memory initialization in parallel with the second processor core. This implementation helps to further shorten memory initialization duration.

2. Memory Training Stage

In this embodiment of this application, the first processor core 31 may invoke the second processor core 321-1 to perform memory training. For example, as shown in FIG. 9, the memory training stage includes the following operations:

In operation S903, the first processor core 31 writes the invocation information to the second processor core 321-1.

In an embodiment of this application, the invocation information may be alternatively stored in the nonvolatile memory 40. Specifically, the nonvolatile memory 40 may further store the firmware of the second processor core 321-1, and the firmware of the second processor core 321-1 includes the invocation information.

It should be noted that firmware of different second processor cores may be the same or may be different. This is not limited in this embodiment of this application. Generally, the at least one second processor core in the memory controller 32 may have same firmware, to reduce occupation in the nonvolatile memory 40.

Figure 8:
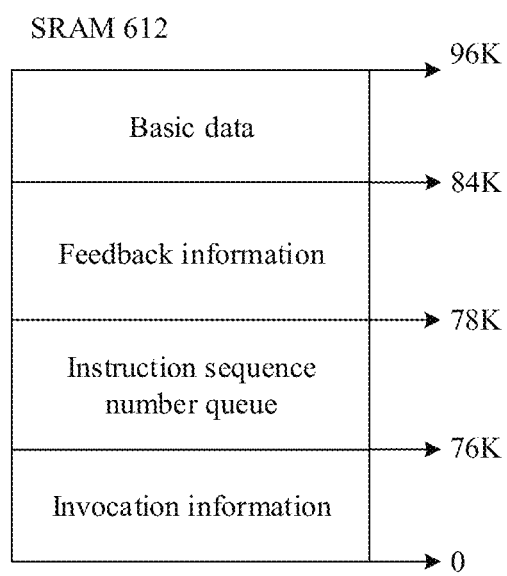
FIG. 8 is a schematic diagram of a structure of data storage in an SRAM according to an embodiment of this application.

In S903, the first processor core 31 may copy the firmware of the second processor core 321-1 to corresponding storage space in the SRAM 612, such as space 0-76K in FIG. 8, so that the second processor core can be started. Then, the first processor core 31 delivers an instruction sequence number to the second processor core 321-1 by writing to the register 611 and the SRAM 612, so as to perform memory initialization.

Figure 10:
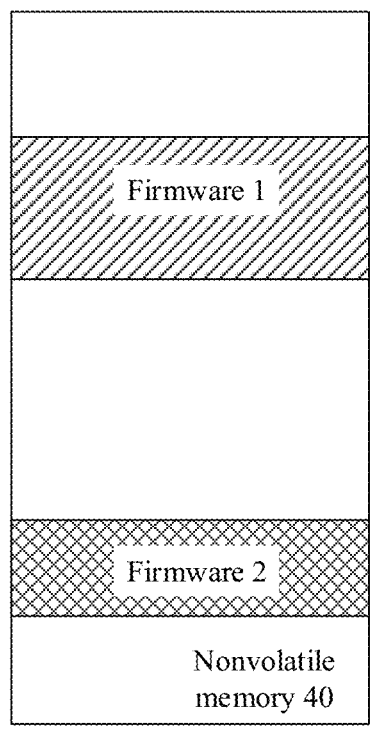
FIG. 10 is a schematic diagram of a storage structure of a nonvolatile memory according to an embodiment of this application.

For example, as shown in FIG. 10, firmware 1 is the firmware of the first processor core 31, firmware 2 is the firmware of the second processor core 321-1, and the firmware 1 and the firmware 2 may be separately stored in different areas in the nonvolatile memory 40. According to this embodiment, same or different compilation manners may be used between the firmware 1 and the firmware 2, and even if the first processor core 31 and the second processor core 321-1 use different architectures, the first processor core 31 can still invoke the second processor core 321-1.

For example, the first processor core 31 uses an advanced reduced instruction set computing machine (ARM) architecture, and the second processor core 321-1 uses a fifth-generation reduced instruction set computing (RISC-V) architecture. In this case, the firmware 1 may be compiled based on the ARM architecture, so that the first processor core 31 can execute the firmware 1; and the firmware 2 may be compiled by using the RISC-V architecture, so that the second processor core 321-1 can execute the firmware 2.

In operation S904, after writing the invocation information, the first processor core 31 writes the reset deassertion information to the storage circuit 322-1, so that the second processor core 321-1 starts to execute the invocation information. In an embodiment, after reading the reset deassertion information, the second processor core 321-1 further executes the firmware of the second processor core 321-1 to initialize the second processor core 321-1. Then, the second processor core 321-1 may enter a ready state, and feed back current state information of the second processor core 321-1 to the first processor core 31.

In operation S905, after the second processor core 321-1 enters the ready state, the first processor core 31 invokes, by using the instruction sequence number, the second processor core 321-1 to perform memory training. For a specific invocation process, refer to the foregoing embodiments, and details are not described again.

In operation S906, the second processor core 321-1 performs memory training based on invocation by the first processor core 31. This process is similar to a conventional memory training process. A difference lies in that memory training in this embodiment of this application is performed by the second processor core 321-1. A specific process is not described again.

3. Memory Testing Stage

As shown in FIG. 9, the memory testing stage includes the following operations:

In operation S907, margin testing is performed.

In operation S908, eye scan is performed.

In operation S909, storage testing is performed.

In operation S910, configuration information is reported. In an embodiment, after all testing such as S907 to S909 is passed, the second processor core 321-1 may report configuration information of the memory channel 1 to the first processor core 31 after channel initialization. The configuration information of the memory channel 1 may include information such as an actual available memory capacity of the memory channel 1.

In operation S911, storage cleanup is performed.

A specific implementation process of S907 to S909 and S911 is similar to a memory testing process in conventional memory initialization. A difference lies in that memory testing in this embodiment of this application is performed by the second processor core 321-1. A specific process is not described in detail.

At this point, channel initialization of the memory channel 1 is completed.

In an embodiment of this application, because the second processor core 321-1 can perform memory initialization in place of the first processor core 31, a time of the first processor core 31 can be released. In other words, when the second processor core 321-1 performs channel initialization, the first processor core 31 may process another task in parallel. For example, the first processor core 31 may perform initialization configuration on another memory channel and a memory chip. For another example, the first processor core 31 may further initialize another component (for example, a peripheral such as a video card or a network adapter).

Specifically, initialization of the other component requires participation of a memory. After channel initialization is completed for any one or more memory channels, the first processor core 31 may initialize another component in parallel by using the memory channel for which channel initialization is completed. The memory channel 1 is used as an example. After channel initialization is completed for the memory channel 1, the memory channel 1 has a stable read/write capability for the memory chip 0 and the memory chip 1. In other words, the first processor core 31 can read from and write to the memory chip 0 and the memory chip 1 through the memory channel 1. Therefore, the first processor core 31 may initialize another component by using the memory channel 1, the memory chip 0, and the memory chip 1.

According to this embodiment, memory initialization and initialization of another component may be performed in parallel, thereby helping to further shorten an electronic-device power-on time, and helping to further improve user experience.

4. System Configuration Stage

For the multi-channel memory controller 32, after channel initialization is completed for each memory channel, the first processor core 31 usually further needs to perform system configuration to generate management information. The management information may be used by the first processor core 31 to manage the memory chip coupled to the memory controller 32. A specific implementation is not described in detail.

For example, as shown in FIG. 9, the system configuration stage includes the following operations:

In operation S912, memory interleaving configuration is performed. In an embodiment, the first processor core 31 may configure contiguous storage addresses for memory chips connected to different memory channels, so that the plurality of memory channels can be accessed in parallel during data reading/writing, thereby helping to increase read/write bandwidth.

For example, the first processor core 31 configures addresses of a part of storage space in the memory chip 1 as 0-20, and configures addresses of a part of storage space in the memory chip 2 as 21-40. In this case, the first processor core 31 may write data to an address interval 0-40 through the memory channel 1 and the memory channel 2. During the writing, a write operation is performed through the memory channel 1 and the memory channel 2 in parallel, thereby greatly increasing a data write speed.

It can be understood that the first processor core 31 may further perform memory interleaving configuration between different banks inside a single memory chip. A specific implementation is not described in detail.

In operation S913, non-uniform memory access (NUMA) setting is performed. In an embodiment, the first processor core 31 may configure access priorities of a plurality of memory channels for each core. The core 0 is used as an example. The first processor core 31 may configure access priorities of a plurality of memory channels for the core 0 based on a delay on a physical link, where a memory channel with a smallest delay on a physical link to the core 0 has a highest priority. According to this embodiment, in a subsequent read/write process, the core 0 can preferentially access the memory channel corresponding to the physical link with the smallest delay, thereby helping to increase an access speed.

In operation S914, memory map resource management is performed. For example, a storage area of an operating system or application data in the memory is determined, and a current memory occupation status is determined.

At this point, memory initialization is completed.

It should be noted that this embodiment of this application not only helps to shorten memory initialization duration, but also facilitates function expansion for the memory controller 32, so that the memory controller 32 can flexibly adapt to different application requirements. Examples are provided below:

1. Power Management

After memory initialization is completed, the first processor core 31 may further invoke the second processor core 321 to perform power management.

The second processor core 321-1 in FIG. 5 is used as an example. The first processor core 31 may invoke the second processor core 321-1 to manage a power supply that supplies power to the memory chip 0 and the memory chip 1. It is assumed that the memory chip 0 and the memory chip 1 share a same power supply. The second processor core 321-1 may monitor a working status of the memory chip 0 and the memory chip 1. For example, the second processor core 321-1 may monitor a quantity of times of reading from and/or writing to the memory chip 0 and the memory chip 1 per unit time, and a quantity of times of occurrence of a correctable error in the memory chip 0 and the memory chip 1.

The second processor core 321-1 may further adjust, based on the working status of the memory chip 0 and the memory chip 1, output power of the power supply that supplies power to the memory chip 0 and the memory chip 1. For example, if the quantity of times of reading from and/or writing to the memory chip 0 and the memory chip 1 per unit time is greater than a first quantity threshold, the output power of the power supply is increased, which may also be understood as increasing an output voltage of the power supply and/or increasing an output current of the power supply. If the quantity of times of reading from and/or writing to the memory chip 0 and the memory chip 1 per unit time is less than a second quantity threshold, the output power of the power supply is reduced.

According to an embodiment, the memory controller 32 can dynamically adjust a power supply of each memory chip based on a working status of the memory chip, thereby helping to reduce power consumption of the memory chip.

2. Repeated Memory Training

After memory initialization is completed, the first processor core 31 may further invoke the second processor core 321 to perform memory training.

The second processor core 321-1 in FIG. 5 is used as an example. As time elapses, a delay of some of signals in the memory channel 1 is offset, and as a result, a time sequence in the memory channel 1 is offset. This affects memory read/write stability.

In view of this, the first processor core 31 may invoke the second processor core 321 to periodically repeat memory training, to keep comparatively accurate alignment of the time sequence in the memory channel 1, thereby helping to improve memory read/write stability.

3. Troubleshooting

After memory initialization is completed, the first processor core 31 may further invoke the second processor core 321 to perform troubleshooting on the memory controller 32. For example, when the memory controller 32 is faulty, the second processor core 321 may determine a faulty node in the memory controller 32, and feed back location information of the faulty node to the first processor core 31.

The second processor core 321-1 in FIG. 5 is used as an example. When the memory channel 1 is faulty, the second processor core 321-1 may determine a faulty node in the memory channel 1, and report location information of the faulty node to the first processor core 31.

4. Firmware Upgrade

In an embodiment of this application, the first processor core 31 may further update firmware of each second processor core, to update a function of the second processor core. For example, the firmware of the second processor core 321-1 includes the foregoing invocation information used to implement memory initialization. The invocation information may be updated by upgrading the firmware of the second processor core 321-1. For example, the instruction in the invocation information may be increased, decreased, or modified, so as to implement expansion and flexible configuration of memory initialization.

For another example, the firmware of the second processor core 321-1 may further include expansion information used to add a function other than memory initialization to the second processor core, and the invocation information may be updated by upgrading the firmware of the second processor core 321-1, to optimize the extended function of the second processor core 321-1. The extended function may be a function such as troubleshooting and power management described above. Upgrading the firmware of the second processor core 321-1 can add a new extended function to the second processor core 321-1, and can also optimize an existing extended function of the second processor core 321-1.

It can be learned that, in this embodiment of this application, adding the second processor core to the memory controller 32 not only helps to shorten memory initialization duration, but also can implement function expansion and optimization for the memory controller without modifying a hardware architecture, so that the memory controller can flexibly adapt to different application requirements.

Based on a same technical idea, an embodiment of this application provides a memory initialization method. The method may be applied to the memory initialization apparatus provided in the foregoing embodiment. For example, during the memory initialization method provided in this embodiment of this application, a first processor core invokes at least one second processor core in a memory controller to perform memory initialization.

For example, the memory controller further includes at least one memory channel, and each memory channel is configured to connect to at least one memory chip. When invoking the at least one second processor core, the first processor core may invoke the at least one second processor core to perform channel initialization on the at least one memory channel in the memory controller. Memory initialization includes channel initialization. For example, channel initialization may include memory training and/or memory testing. For example, in S903 to S911 in FIG. 9, the first processor core may invoke the second processor core to perform memory training, and/or invoke the second processor core to perform memory testing.

For example, the at least one second processor core in the memory controller may be correspondingly connected to the at least one memory channel. For example, the connection may be a one-to-one connection, a one-to-many connection, or a many-to-one connection.

Generally, in a memory initialization process, system configuration, such as memory interleaving configuration, NUMA setting, and memory map resource management, further needs to be performed on the memory controller. In view of this, as shown in S912 to S914 in FIG. 9, after channel initialization is completed for each memory channel in the memory controller, the first processor core performs system configuration on the memory controller 32 and a memory chip connected to the at least one memory channel, to generate management information. The management information may be used by the first processor core to manage the memory chip connected to the at least one memory channel.

It can be understood that, because the at least one second processor core in the memory controller can perform channel initialization in place of the first processor core in this embodiment of this application, a time of the first processor core can be released, so that the first processor core can initialize another component in parallel while the at least one second processor core is performing channel initialization. For example, after channel initialization is completed for any memory channel, the first processor core may further initialize another component by using the any memory channel for which channel initialization is completed and at least one memory chip connected to the any memory channel.

In an embodiment, as shown in S901 and S902 in FIG. 9, after initialization configuration is completed for a first memory channel and at least one first memory chip connected to the first memory channel, the first processor core may invoke a second processor core correspondingly connected to the first memory channel. The first memory channel may be any one of the at least one memory channel in the memory controller.

In an embodiment of this application, the first processor core may first complete initialization configuration for all of the at least one memory channel in the memory controller, and then invoke the at least one second processor core together; or the first processor core may perform initialization configuration and invoke the second processor core in parallel. Details are as follows:

After invoking the second processor core correspondingly connected to the first memory channel, the first processor core may continue to perform initialization configuration on a second memory channel and at least one second memory chip connected to the second memory channel. The second memory channel is any memory channel for which channel initialization is not started in the at least one memory channel.

To allow the first processor core to invoke the at least one second processor core, in an embodiment, the memory controller may further include at least one storage circuit, and the at least one storage circuit may be correspondingly connected to the at least one second processor core in the memory controller.

When the first processor core invokes any second processor core, the first processor core may write invocation information to a storage circuit correspondingly connected to the any second processor core. The any second processor core may read the invocation information from the correspondingly connected storage circuit, and execute the invocation information. For example, the storage circuit may include any one or more of a register and/or a static random access memory.

In an embodiment, after the first processor core writes the invocation information to the storage circuit correspondingly connected to the any second processor core, the first processor core may further write reset deassertion information to the storage circuit. After reading the reset deassertion information, the any second processor core may read the invocation information from the correspondingly connected storage circuit, and execute the invocation information.

To implement more flexible invocation, in an embodiment, the invocation information may include at least one instruction, and the first processor core may invoke, by using an instruction sequence number, the any second processor core to execute an instruction corresponding to the instruction sequence number.

Running of some of instructions further requires a specific execution parameter. Therefore, the first processor core may further first write an execution parameter corresponding to the instruction to the storage circuit correspondingly connected to the any second processor core, and then invoke, by using the instruction sequence number, the any second processor core to execute the instruction corresponding to the instruction sequence number.

In an embodiment, the any second processor core may further feed back an instruction execution result to the first processor core.

Generally, firmware of the any second processor core is stored in a nonvolatile memory and can be updated, and the firmware includes the invocation information.

Generally, before writing the invocation information to the storage circuit correspondingly connected to the any second processor core, the first processor core may further allocate a communication address to the storage circuit. The first processor core may read data from or write data to the storage circuit based on the communication address.

It should be noted that the memory initialization method provided in this embodiment of this application not only helps to shorten memory initialization duration, but also facilitates function expansion for the memory controller, so that the memory controller can flexibly adapt to different application requirements. Examples are provided below:

1. Power Management

After memory initialization is completed, the first processor core may further invoke the second processor core correspondingly connected to the first memory channel, to manage output power of a power supply. The first memory channel may be any memory channel in the memory controller, and the power supply may supply power to the at least one first memory chip correspondingly connected to the first memory channel. The second processor core correspondingly connected to the first memory channel may monitor a working status of the at least one first memory chip. In addition, the second processor core correspondingly connected to the first memory channel adjusts the output power of the power supply based on the working status of the at least one first memory chip.

2. Repeated Memory Training

After memory initialization is completed, the first processor core may further invoke the at least one second processor core in the memory controller to perform memory training.

3. Troubleshooting

After memory initialization is completed, the first processor core may further invoke the at least one second processor core in the memory controller to perform troubleshooting. When the memory controller is faulty, the at least one second processor core may determine a faulty node in the memory controller, and feed back location information of the faulty node to the first processor core.

4. Firmware Upgrade

In an embodiment of this application, the first processor core may further update firmware of each second processor core, to update a function of the second processor core. For example, the firmware of the second processor core includes information used to add an extended function to the second processor core. The firmware of the second processor core may be updated, so that the second processor core can implement more functions, such as troubleshooting and power management described above. In addition, an existing function of the second processor core may also be optimized by updating the firmware of the second processor core.

For another example, the firmware of the second processor core includes the invocation information used to implement memory initialization. Further, the firmware of the second processor core may be updated to optimize operations performed by the second processor core in a memory initialization process. For example, some instructions are added or removed. For another example, initialization operations corresponding to some instructions are modified.

After the first processor core is powered on, the first processor core may write the updated firmware of the second processor core to the memory of the second processor core, so as to complete firmware upgrade of the second processor core.

It can be learned that, in an embodiment of this application, adding the second processor core to the memory controller not only helps to shorten memory initialization duration, but also can implement function expansion and optimization for the memory controller without modifying a hardware architecture, so that the memory controller can flexibly adapt to different application requirements.

Based on a same technical idea, an embodiment of this application further provides a computer system. The computer system may include the memory initialization apparatus provided in any one of the foregoing embodiments, and a memory chip coupled to the memory initialization apparatus. For example, the computer system may be a computer mainboard, or may be an electronic device such as a notebook computer, a mobile phone, or a digital camera. This is not limited in this embodiment of this application.

A person skilled in the art should understand that the embodiments of this application may be provided as a method, a system, or a computer program product. Therefore, the present application may use a form of hardware only embodiments, or embodiments with a combination of software and hardware. Moreover, this application may use a form of a computer program product that is implemented on one or more computer-usable storage media (including but not limited to a magnetic disk memory, a CD-ROM, an optical memory, and the like) that include computer-usable program code.

This application is described with reference to the flowcharts and/or block diagrams of the method, the device (or system), and the computer program product according to this application. It should be understood that computer program instructions may be used to implement each process and/or each block in the flowcharts and/or the block diagrams and a combination of processes and/or blocks in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and operations are performed on the computer or the other programmable device, thereby generating computer-implemented processing. Therefore, the instructions executed on the computer or the other programmable device provide operations for implementing a specific function in one or more processes in the flowcharts and/or in one or more blocks in the block diagrams.

Definitely, a person skilled in the art can make various modifications and variations to this application without departing from the spirit and scope of this application. This application is intended to cover these modifications and variations of this application provided that the modifications and variations fall within the scope of protection defined by the following claims and their equivalent technologies.

What is claimed is:

1. A memory initialization apparatus, comprising:
   a memory controller comprising at least one second processor core; and
   a first processor core configured to invoke the at least one second processor core of the memory controller to perform memory initialization,
   wherein the first processor core is further configured to:
   after channel initialization is completed for any memory channel, initialize, by using the any memory channel and at least one memory chip connected to the any memory channel, a component other than the memory chip.

2. The memory initialization apparatus according to claim 1, wherein the memory controller further comprises at least one memory channel, and each memory channel is configured to connect to at least one memory chip; and the first processor core is configured to:
invoke the at least one second processor core to perform channel initialization on the at least one memory channel.

3. The memory initialization apparatus according to claim 2, wherein the channel initialization comprises at least one of memory training or memory testing.

4. The memory initialization apparatus according to claim 2, wherein the first processor core is further configured to:
after channel initialization is completed for each of the at least one memory channel, perform system configuration on the memory controller and a memory chip connected to the at least one memory channel, to generate management information, wherein the management information is used by the first processor core to manage the memory chip connected to the at least one memory channel.

5. The memory initialization apparatus according to claim 2, wherein the at least one second processor core is connected to the at least one memory channel respectively; and
the first processor core is configured to:
after initialization configuration is completed for a first memory channel and at least one first memory chip connected to the first memory channel, invoke a second processor core connected to the first memory channel, wherein the first memory channel is any one of the at least one memory channel.

6. The memory initialization apparatus according to claim 5, wherein the first processor core is configured to:
after invoking the second processor core correspondingly connected to the first memory channel, continue to perform initialization configuration on a second memory channel and at least one second memory chip connected to the second memory channel, wherein the second memory channel is any memory channel for which channel initialization is not started in the at least one memory channel.

7. The memory initialization apparatus according to claim 5, wherein the first processor core is further configured to:
after the memory initialization is completed, invoke the second processor core connected to the first memory channel, to manage output power of a power supply that is configured to supply power to the at least one first memory chip.

8. The memory initialization apparatus according to claim 7, wherein the second processor core connected to the first memory channel is further configured to:
monitor a working status of the at least one first memory chip; and
adjust the output power of the power supply based on the working status of the at least one first memory chip.

9. The memory initialization apparatus according to claim 1, wherein the memory controller further comprises at least one storage circuit connected to the at least one second processor core respectively;
the first processor core is configured to separately write invocation information to the at least one storage circuit, wherein the invocation information is information used to perform the memory initialization; and
the at least one second processor core is configured to read the invocation information from a correspondingly connected storage circuit and execute the invocation information.

10. The memory initialization apparatus according to claim 9, wherein the invocation information comprises at least one instruction; and
the first processor core is configured to:
invoke, by using an instruction sequence number, the at least one second processor core to execute an instruction corresponding to the instruction sequence number.

11. The memory initialization apparatus according to claim 9, wherein firmware of the at least one second processor core is stored in a nonvolatile memory and can be updated, and the firmware comprises the invocation information.

12. The memory initialization apparatus according to claim 1, wherein the first processor core is further configured to:
after the memory initialization is completed, invoke the at least one second processor core to perform memory training.

13. The memory initialization apparatus according to claim 1, wherein the first processor core is further configured to:
after the memory initialization is completed, invoke the at least one second processor core to perform troubleshooting.

14. The memory initialization apparatus according to claim 13, wherein the at least one second processor core is further configured to:
when the memory controller is faulty, determine a faulty node in the memory controller, and feed back location information of the faulty node to the first processor core.

15. A memory initialization method, comprising:
invoking, by a first processor core of an apparatus, at least one second processor core;
performing memory initialization via the invoked at least one second processor core, wherein the apparatus further comprises a memory controller, the memory controller including the at least one second processor core; and
after channel initialization is completed for any memory channel, initializing, by the first processor core by using the any memory channel and at least one memory chip connected to the any memory channel, a component other than the memory chip.

16. The memory initialization method according to claim 15, wherein the memory controller further comprises at least one memory channel, and each memory channel is configured to connect to at least one memory chip; and
wherein invoking the at least one second processor core comprises:
invoking, by the first processor core, the at least one second processor core to perform channel initialization on the at least one memory channel.

17. The memory initialization method according to claim 16, wherein the channel initialization comprises at least one of memory training or memory testing.

18. The memory initialization method according to claim 16, further comprising:
after channel initialization is completed for each of the at least one memory channel, performing, by the first processor core, system configuration on the memory controller and a memory chip connected to the at least one memory channel, to generate management information, wherein the management information is used by the first processor core to manage the memory chip connected to the at least one memory channel.

19. The memory initialization method according to claim 16, wherein the at least one second processor core is connected to the at least one memory channel respectively; and wherein invoking the at least one second processor core to perform channel initialization on the at least one memory channel comprises:

after initialization configuration is completed for a first memory channel and at least one first memory chip connected to the first memory channel, invoking, by the first processor core, a second processor core connected to the first memory channel, wherein the first memory channel is any one of the at least one memory channel.

20. The memory initialization method according to claim 19, wherein invoking the at least one second processor core to perform channel initialization on the at least one memory channel comprises:

after invoking the second processor core correspondingly connected to the first memory channel, continuing, by the first processor core, to perform initialization configuration on a second memory channel and at least one second memory chip connected to the second memory channel, wherein the second memory channel is any memory channel for which channel initialization is not started in the at least one memory channel.

21. The memory initialization method according to claim 19, wherein after the memory initialization is completed, the method further comprises:

invoking, by the first processor core, the second processor core connected to the first memory channel, to manage output power of a power supply that is configured to supply power to the at least one first memory chip.

22. The memory initialization method according to claim 21, further comprising:

monitoring, by the second processor core connected to the first memory channel, a working status of the at least one first memory chip; and adjusting, by the second processor core connected to the first memory channel, the output power of the power supply based on the working status of the at least one first memory chip.

23. The memory initialization method according to claim 15, wherein the memory controller further comprises at least one storage circuit connected to the at least one second processor core respectively; and wherein invoking the at least one second processor core comprises:

separately writing, by the first processor core, invocation information into the at least one storage circuit, wherein the invocation information is used to perform the memory initialization; and reading, by any one of the at least one second processor core, the invocation information from a correspondingly connected storage circuit, and executing the invocation information.

24. The memory initialization method according to claim 23, wherein the invocation information comprises at least one instruction; and wherein reading the invocation information from a correspondingly connected storage circuit comprises:

invoking, by the first processor core by using an instruction sequence number, the at least one second processor core to execute an instruction corresponding to the instruction sequence number.

25. The memory initialization method according to claim 23, wherein firmware of the at least one second processor core is stored in a nonvolatile memory and can be updated, and the firmware comprises the invocation information.

26. The memory initialization method according to claim 15, wherein after the memory initialization is completed, the method further comprises:

invoking, by the first processor core, the at least one second processor core to perform memory training.

27. The memory initialization method according to claim 15, wherein after the memory initialization is completed, the method further comprises:

invoking, by the first processor core, the at least one second processor core to perform troubleshooting.

28. A computer system, comprising:
a memory initialization apparatus, comprising:
a memory controller comprising at least one second processor core; and
a first processor core configured to invoke the at least one second processor core of the memory controller to perform memory initialization; and
a memory chip coupled to the memory initialization apparatus,
wherein the first processor core is further configured to:
after a channel initialization is completed for any memory channel connected to the memory chip, initialize, by using the any memory channel and the memory chip, a component other than the memory chip.

* * * * *